(12) United States Patent
Willner et al.

(10) Patent No.: US 8,129,624 B2
(45) Date of Patent: Mar. 6, 2012

(54) PRESSURE SENSOR

(75) Inventors: Andrew F. Willner, Attleboro, MA (US); Lauren Snedeker, North Attleboro, MA (US); Brian Wilkie, Tiverton, RI (US); Gifford Plume, North Scituate, RI (US); Prasanth Ambady, Providence, RI (US)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 12/788,950

(22) Filed: May 27, 2010

(65) Prior Publication Data

US 2011/0290539 A1 Dec. 1, 2011

(51) Int. Cl.
*H05K 1/03* (2006.01)
(52) U.S. Cl. ........ 174/255; 204/450; 204/601; 257/295; 257/529; 257/668; 257/751; 257/787; 438/282; 438/597; 438/622; 438/624; 438/674; 266/212; 29/890.1; 430/322
(58) Field of Classification Search ............... 174/255; 204/450, 601; 257/668, 787, 295, 529, 751; 600/488, 561; 438/282, 597, 622, 624, 674; 266/212; 29/890.1; 430/322
See application file for complete search history.

(56) References Cited

U.S. PATENT DOCUMENTS

| | | | | |
|---|---|---|---|---|
| 4,825,876 | A * | 5/1989 | Beard | 600/488 |
| 5,173,766 | A * | 12/1992 | Long et al. | 257/687 |
| 6,033,544 | A * | 3/2000 | Demers et al. | 204/450 |
| 6,763,724 | B2 | 7/2004 | DiPaola et al. | |
| 2004/0132900 | A1* | 7/2004 | Sachdev et al. | 524/606 |
| 2007/0154631 | A1* | 7/2007 | Sachdev et al. | 427/140 |

* cited by examiner

*Primary Examiner* — Xiaoliang Chen
(74) *Attorney, Agent, or Firm* — Chapin IP Law, LLC

(57) ABSTRACT

A pressure sensor includes a sense element port, a support ring and a plurality of interference fit slits to provide a flexible interference fit between the sense element port and the support ring to form a substantially flush lap joint. The sensor also includes an electronics board inside the support ring and attached to planar mounting tabs which provide a stable mounting. Gel flow barriers protect electronics board features from unwanted non-conductive gel. Double-ended symmetrical, tapered contact springs provide manufacturing cost savings and contribute to improved alignment of an interface connector of the sensor.

4 Claims, 9 Drawing Sheets

PRESSURE SENSOR

FIELD OF THE INVENTION

This invention relates generally to pressure sensors and more particularly to sensors using strain gauge technology for sensing pressure change to produce an electrical signal related to such change and employing electronics for processing and amplifying the signal.

BACKGROUND OF THE INVENTION

Although the use of strain gauge technology for converting changes in fluid pressure to related electrical signals is known, there exists a need to provide sensors which are more easily manufactured and which have improved reliability and optimum life expectancy. There is also a need to minimize the cost of producing the sensors so as to make it more economically feasible to use them in given applications and thus increase manufacturing volume with resulting savings in large volume manufacturing techniques.

In issued U.S. Pat. No. 6,763,724, assigned to the assignee of the present invention, a pressure sensor using strain gauge technology is disclosed and claimed comprising a tubular port fitting having a fluid receiving opening at one end and a closed, integrally formed diaphragm at an opposite pedestal end, an angular orientation feature and a locking feature for locking receipt of a support member on the pedestal end. The support member has an aperture flat end wall received over the diaphragm portion, the aperture being in alignment with strain gauge sensor elements glass bonded to the diaphragm portion. Wires are bonded both to the strain gauge sensor elements and to circuit pads on the bonded lobe section of the flexible circuit assembly and encapsulated by silicone gel. The entire teachings and contents of this referenced issued patent are hereby incorporated by reference in its entirety.

In automotive applications, the pressure sensors need to be manufactured in high volume at a low cost and must be very reliable in the harsh environment in safety critical (e.g., braking system) applications. In the assembly of strain gage based pressure and force sensors, the isolation of the sense element diaphragm from mechanical stresses in the electronics board (due to humidity, thermal expansion, and the like) drives the use of a so-called "support ring". In existing practice, support rings are made of either metal (soldered to the electronics board and butt welded to the sense element port structure) or plastic (glued to the electronics board and snap-fit to the sense element port structure). The support ring and its attachment should provide a stable platform for successful wire bonding between the sense element and the electronics board. Metal support rings also serve as conductive paths between the electronics board decoupling capacitors and the sense element port structure. In existing practice the support ring is an internal component of the sensor assembly and is not subject to handling after a protective sensor housing is installed around it.

It is important for a consistent weld process that the lip of the support ring is uniformly thick, free from burrs, and sits flat against the sense element port. In practice, the lip is difficult to form and defects can result in poor welds due to excessive gaps between support ring and sense element port, burn through of support ring, or a laser welder missing the support ring to port interface location.

In the assembly of pressure sensors a protective gel as known in the art is dispensed over wire bonds, glass, and gages to protect against corrosion (wire bonds) and degradation (glass). Bubbles or voids in the gel, depending on their location, sometimes allow corrosion or degradation, or cause mechanical damage to bond wires or bonds. Because of these problems, it is desirable for the gel to be easily inspectable. Presence of gel (an electrical insulator) on electrical contact spring landing pads can cause unwanted open or intermittent contacts. Typically, wire bond windows in the printed circuit boards (PCBs) through which wires are connected to strain gauges, are generally rectangular in shape. The assembly is dimensioned such that with tolerance stack-up, it is possible for the edge of the glass nearest the outer diameter of the diaphragm to be obscured by the PCB. The close vertical spacing of the PCB to the diaphragm can lead to a lack of gel flow in this area, leaving the glass (on which the strain gauges are mounted) unprotected from degradation (a cause of output signal offset shift). There is a need for a design which easily permits gel flow over the most peripherally located glass. In one conventional solution, gel is prevented from flowing to unwanted locations by a combination of strategic placement of SMT components, and by a plastic gel dam component. However, there is a need to manage gel flow without use of additional components which increase costs, and in some cases require additional circuit board real estate, thereby negatively impacting space constraints.

Conventional pressure sensors used in, for example, automotive brake systems require connections between the pressure sensor and electronic control units (ECU). These connections are often made with springs or spring-loaded pogo pin contacts. Such connections are provided as part of the ECU or as part of the sensor assembly. Conventional pressure sensors typically use relatively expensive pogo pins or springs with one or two diameters. In some applications the springs are not symmetrical and must be loaded by hand in the assembly process. It is critical to provide mechanical guidance to the springs to ensure that they make contact with target pads both inside the sensor and on the ECU. The springs must be prevented from buckling. The springs must move freely along their axes and provide the required contact forces.

Pogo pin solutions are expensive because they require machined housings around the springs and extra sub-assembly operations. Customers do not prefer springs provided as part of the ECU since they require spring procurement, handling, and mechanical guidance. Current solutions with springs provided as part of the sensor assembly require multi-piece sub-assemblies including printed circuit boards (PCB's) and multiple orientations of the parts or other special measures during assembly (to prevent springs from falling out due to gravity). The solution of insert molding springs is difficult because of potentially serious difficulties with methods for properly sealing the mold against the spring, preventing mold flash, and precisely orienting the spring tips towards their target contact pads. Furthermore, the cost of handling springs is not eliminated but merely moved in the supply chain, so no cost benefit accrues.

SUMMARY

Conventional pressure sensors use expensive contact assemblies, seam welded components and gel dams to block the flow of protective gel from certain area on electronics boards. In contrast to conventional pressure sensor designs, embodiments disclosed herein provide for a single electronics board, improved environmental protection, and less expensive contact assemblies which are easier to manufacture in high volumes.

In one embodiment, a pressure sensor includes a sense element port, a support ring including at least one mounting tab and a plurality of interference fit slits to provide a flexible interference fit between the sense element port and the support ring such that opposing side walls of sense element port and the support ring form a substantially flush lap joint. The sensor also includes an electronics board disposed inside the support ring and attached to the at least one mounting tab and having a plurality of contact pads. Such a design allows parts to be aligned and fit together to provide a much larger process window when joining the sense element port and the support ring. This design also avoids laser burn through when welding the sense element port to the support ring. Special complicated geometry of either the sense element port or the support ring is not required so the edge condition of the support ring is not critical to weld performance and therefore a larger process window is provided.

Such a design can provide a sensor without a separate external housing component to save costs. The flexible interference fit provides compatibility with existing laser weld tooling to save capital costs, and is adaptable to resistance welding. The design provides robust handling because the support ring is exposed in the final assembly. The design does not require selective plating of the support ring which reduces cost and is compatible with laser thru welding.

In another embodiment, the support ring includes at least three planar mounting tabs, and the electronics board includes attachment pads soldered to corresponding planar mounting tabs and contact pads corresponding to at least three planar mounting tabs. The resulting stable structure avoids flexing the electronics board to prevent breakage of brittle electronic components and provides mechanical support for contact springs in an interface connector.

In yet another embodiment, the electronics board further includes an oversized wire bond window adapted to provide access to sensor contacts to facilitate wire bonding and visibility of the sensor contacts. Changing the conventional rectangular shape of the wire bond window solves several problems including the formation of bubbles and voids, inspection of strain gauges and the dispensed protective gel. In a particular embodiment the oversized wire bond window includes rounded corners and is lengthened approximately on an axis along a longer dimension of strain gauges mounted on the sense element port. Such a design facilitates inspection of the strain gauges and the dispensed protective gel in the wire bond window and reduces problems due to skewing of the window with respect to the strain gauges. Additionally, it has been discovered that such an oversized wire bond shape promotes a reduction of bubbles and voids when dispensing protective gel.

In another embodiment, gel flow barriers on the electronics board include a moat to redirect gel flow. The moat includes one or more walls forming one or more trenches. The moat includes a top layer having a non-wetting surface with respect to a protective gel. By eliminating a gel dam to contain unwanted gel, there is one less separate part which needs to be attached to the electronics board. In addition to eliminating a component, the opportunity that another part catches on one gel dam is also eliminated.

A technique to form a gel flow barrier includes the steps of: fabricating a plurality of multi-layer trenches and corresponding walls in electronics printed circuit board (PCB) surrounding a board feature to be protected from a gel flow. The plurality of multi-layer walls form trenches providing a moat at least partially surrounding a board feature to be protected. Such a technique provides a cost effective mean of managing gel flow and flexibility in the placement of protection from unwanted gel flow for features on the electronic board. A technique to apply a gel includes providing a gel flow barrier on an electronics board the gel flow barrier having a non-wetting surface with respect to a protective gel, positioning the gel flow barrier to protect an electrical contact pad and providing an oversized wire bond window. The gel flow is managed by dispensing the gel into the oversized wire bond window and over wire bond pads on the electronics board such that the gel flow barrier redirects the gel thereby preventing the gel from flowing onto the electrical contact pad.

An exemplary interface connector assembly includes an upper spring guide adapted for retaining an elastic contact member and a lower spring guide adapted to attach to the upper spring guide. The elastic contact member comprises a double-ended symmetrical spring having dual tapered ends such that a contact point at each end of the spring is closer to a center axis/center line of the spring. Such an interface connector assembly provides effective spring capture without the use of expensive pogo pins or PCB's. The connector can be pre-assembled separately, and in some circumstances, the assembly can occur outside of clean-room conditions required to assemble the strain gauges and spring symmetry reduces orientation concerns during manufacturing and allows for automated feeding of the springs.

In another embodiment, the springs in the interface connector are conically tapered to further align the spring tip center towards the center of a contact receiving pad on the electronics board. A first taper effectively causes the spring to have a smaller diameter tip and therefore reduces locating concerns when aiming for a contact pad of an electronics board or ECU. Additionally, a second taper allows for reliable capture and retain of the spring in a spring guide.

Such designs and techniques described above facilitate packaging to provide high volume manufacturing and high reliability. The embodiments disclosed herein, may be employed in devices such as those manufactured by Sensata Technologies, Inc. of Attleboro, Mass., U.S.A.

BRIEF DESCRIPTION OF THE DRAWINGS

The foregoing will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Embodiments of the invention disclosed herein provide for a novel pressure sensor for use in measuring pressure.

Embodiments disclosed herein include a newly designed gel flow barrier that isolates certain printed circuit board (PCB) features and components from protective gel applied to other areas of the PCB. Additionally, embodiments include a newly designed contact spring adapted to facilitate manufacture of the pressure sensor while minimizing the effect of tolerance stack-up. In particular, in one embodiment, a support ring includes planar mounting tabs which provide stable support for a single electronics board and support for elastic contact members, for example, double-ended symmetrical springs having a conical taper at both ends.

Figure 1:
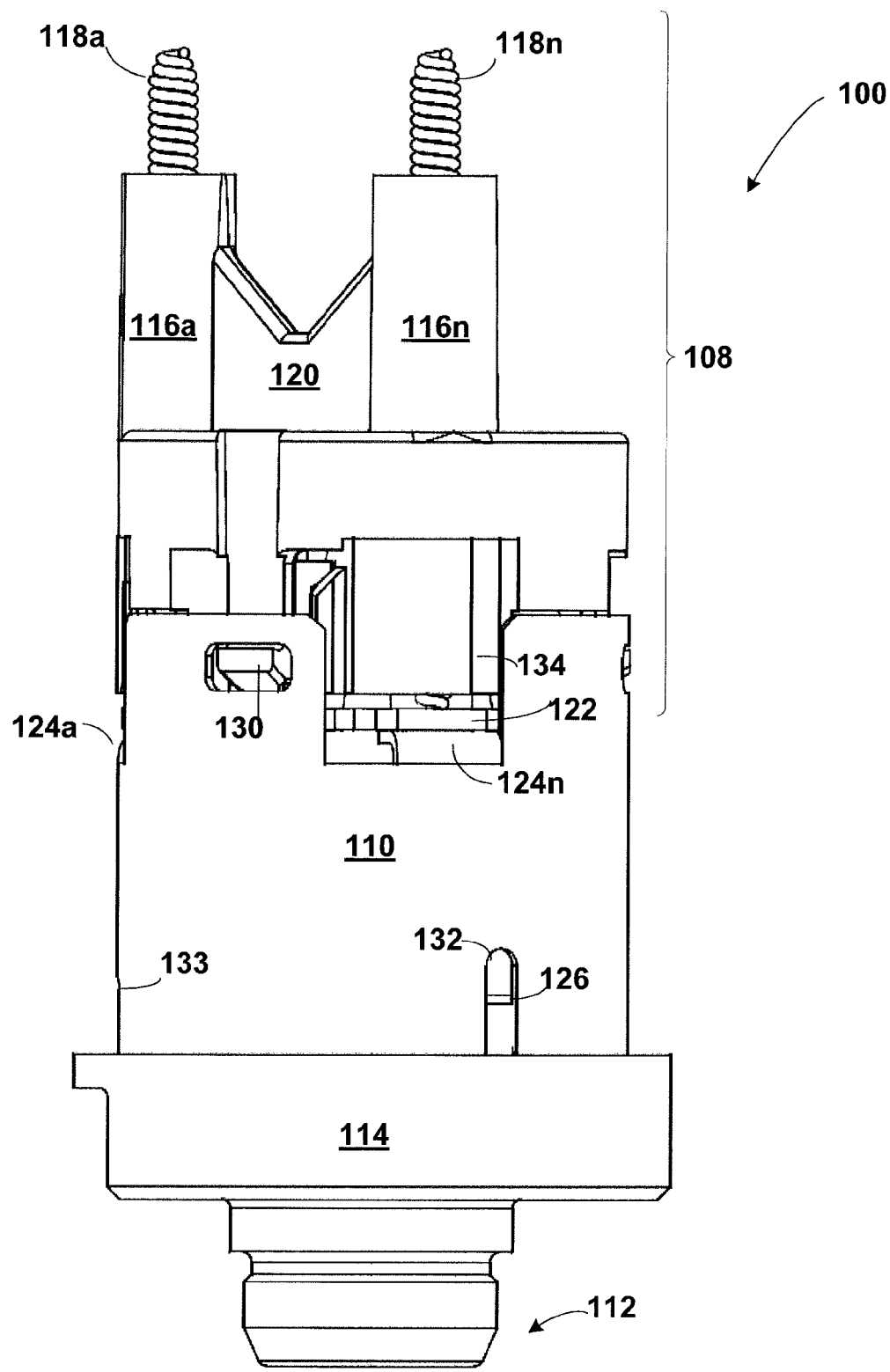
FIG. 1 illustrates a cross-sectional view of a pressure sensor in accordance with embodiments disclosed herein.

FIG. 1 illustrates a pressure sensor 100 configured in accordance with one example embodiment. The pressure sensor 100 includes a contact housing sub-assembly 108 which includes an upper spring guide 120 (also referred to as upper contact housing) coupled to a lower spring guide 134 (also referred to a lower contact housing). The contact housing sub-assembly 108 is coupled to a support ring 110 which is coupled to a sense element port 114.

In one embodiment the lower spring guide 134 is coupled to the upper spring guide 120 with a snap fit connection 130. The contact housing sub-assembly 108 includes a plurality of contact springs 118a-118n (collectively referred to as contact springs 118 or springs 118) which are held in place by corresponding spring retainers 116a-116n. The sense element port 114 includes lead-in chamfers 126 and is coupled to port fitting 112. The support ring 110 includes at least one interference fit slit 132. The support ring 110 also includes planar mounting tabs 124a-124n (collectively referred to as planar mounting tabs 124) to support and electrically contact electronics board 122, also referred to as printed circuit board 122 (PCB) or electronics board 122.

In operation, silicon strain gauges 182 (not shown in this view) which are deposited on a glass surface on a diaphragm produce a signal which is coupled to the electronics board 122 through wires running routed through an oversized wire bond window 140 (FIG. 3) to connections on the electronics board 122. In response to fluid pressure the diaphragm domes up thereby straining strain gauges 182. The silicon strain gauges 182 are wired in a Wheatstone bridge arrangement that is coupled to internal electronics on the electronics board 122 to provide an offset, conditioned, temperature compensated electronic output reflecting a fluid pressure. The electronics board 122 includes a custom integrated circuit for signal conditioning and other components for filtering and electrostatic discharge (ESD) protection.

Electrical connections between pressure sensor 100 and electronic control units (ECU) (not shown) in, for example, automotive brake systems, are made with contact springs 118. It is understood that other types of elastic contact members can be used in place of spring contacts. The electronics board 122 can optionally convert the output voltage to a digital format to communicate with the ECU. The digital output can include redundant signals on a single contact.

During manufacturing the interference fit slits 132 ensure that opposing side walls of sense element port and the support ring form a substantially flush lap joint contact between the surfaces to be welded. In an alternative embodiment, bump protrusions (not shown) on the support ring 110 are designed to mate with a cylindrical portion of the sense element port 114 with a slight interference, self-centering the support ring on the port, and ensuring contact between the surfaces to be welded using, for example, a laser or resistance welding.

In contrast to conventional pressure sensors, the pressure sensor 100 support ring 110 does not require protective sensor housing although a protective housing can be used. In an exemplary sensor, three planar mounting tabs 124 support a single electronics board 122 in contrast to multiple electronics board used in conventional pressure sensors. In one embodiment the 100 support ring 110 is a drawn stainless steel part.

Figure 2:
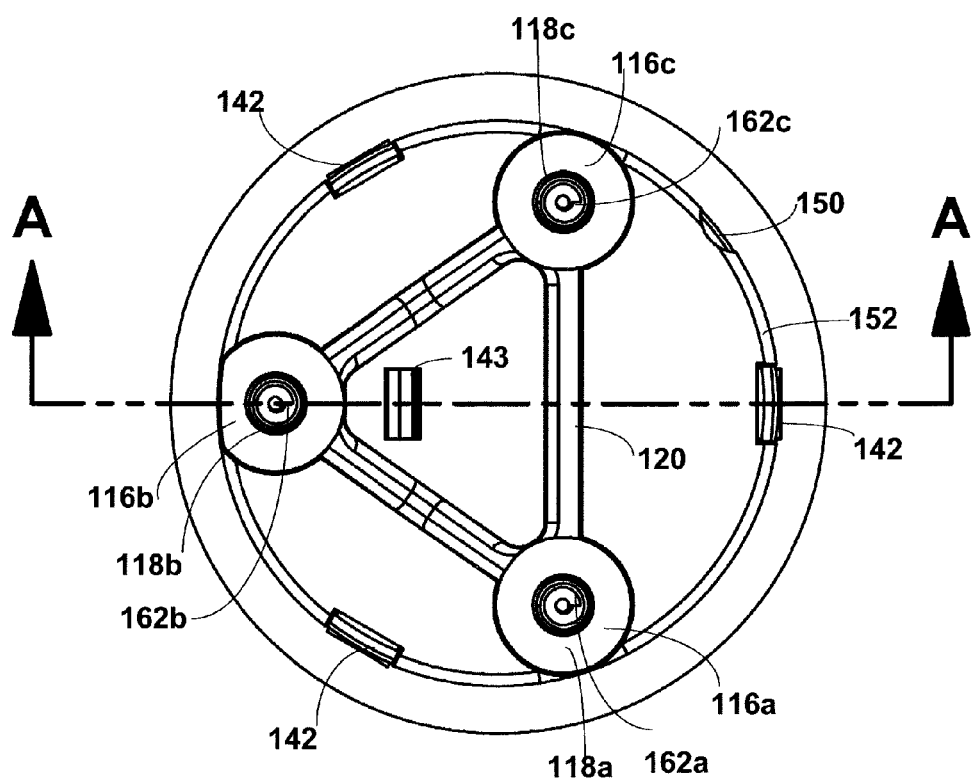
FIG. 2 is a top plan view of the pressure sensor of FIG. 1.

In more specific detail, as seen in FIGS. 2 (a top view) and 2A (a cross section view), pressure sensor 100 includes upper spring guide 120 of the contact housing sub-assembly 108 which houses the springs 118. The springs terminate in spring tip contact points 162.

The contact housing sub-assembly 108 with springs 118 form the interface connection to the ECU and make electrical connections through the spring tip contact points 162. In one embodiment the location of the springs 118 and the corresponding planar mounting tabs 124 are designed to meet customer ECU specifications, and the contact housing sub-assembly 108 is attached to the support ring via a snap fit. The contact housing sub-assembly 108 also includes snap features 142, access hole 143 and gate for molding upper spring guide 150.

Figure 2A:
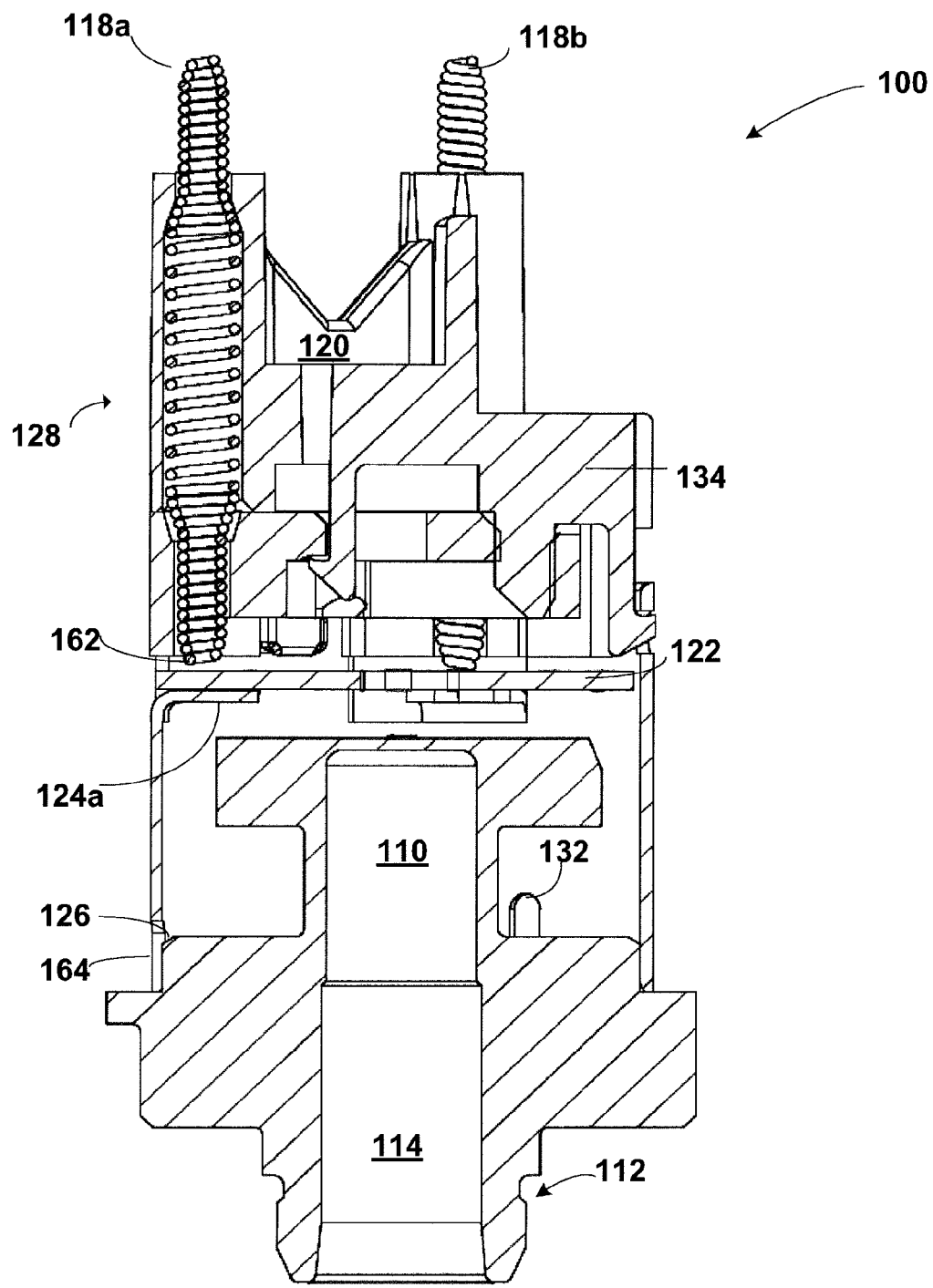
FIG. 2A is a cross-sectional view taken on line 2A-2A of FIG. 2.

Referring now to FIG. 2A, the support ring 110 includes a plurality of interference fit slits 132 to provide a flexible interference fit between the sense element port 114 and the support ring 110 such that opposing side walls of sense element port and the support ring form a substantially flush lap joint. The interference fit slits 132 and a tooling alignment notch provide better manufacturing tolerances and self centering and alignment of components during manufacture. In one embodiment, the flexible interference fit provided by the interference fit slits 132 minimizes support ring 110 to sense element port 114 insertion force and encourages intimate contact between the opposing walls of the sense element port 114 and the support ring 110. The sense element port 114 includes the lead-in chamfers 126.

In one exemplary process, the welding laser is aimed at the middle of the lap joint 164. In this process, the laser welds through the middle of the lap joint 164 offset from a bottom edge of the support ring 110 at approximately at the middle of the substantially flush lap joint, thereby eliminating any support ring bottom edge conditions from influencing weld quality and enabling a larger process window than when using butt welds. It is understood that the lap joint can be welded using a laser (continuous or spot welding), resistance welding or other welding techniques know in the art. In certain alternative embodiments, the support ring planar mounting tabs 124 are gold plated to permit soldering of the electronics board, while the support ring 110 remains unplated in the region of the weld to prevent contamination of the weld.

Referring again to FIG. 2A, the contact housing sub-assembly 108 (also referred to as spring guide sub-assembly 108) includes the upper spring guide 120 adapted for retaining an elastic contact member, here spring 118 attached to the lower spring guide 134. In one embodiment, the upper spring guide 120 is snap fitted to the lower spring guide 134, and the spring guide sub-assembly 108 includes three springs. The spring guide sub-assembly 108 including the guided springs 118 provides the electrical interface connection to the ECU.

Splitting the spring guide sub-assembly 108 into two components allows for close guidance of each spring end towards its target, permits cost-effective spring capture without the use of expensive pogo pins or PCB's, and allows the connector to be pre-assembled. The upper and lower spring guides 120 and 134 are connected to each other by means of snap fit features. The upper and lower spring guides have mating orientation features to ensure proper alignment. In addition to snap fit other techniques including but not limited to heat staking, welding and gluing can be used to join the upper and lower spring guides 120 and 134.

Figure 3:
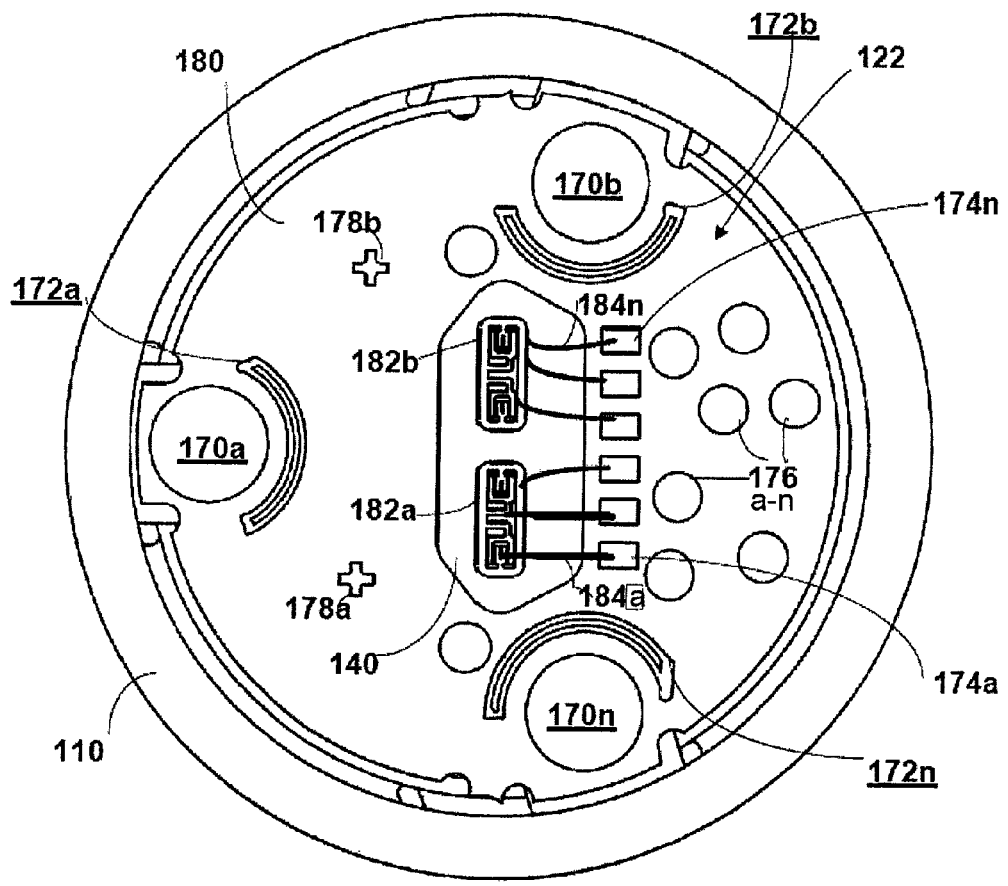
FIG. 3 is a top plan view of an electronics board of the pressure sensor of FIG. 1 including gel flow barriers.

Referring now to FIG. 3, the upper side 180 of electronics board 122 includes an oversized wire bond window 140, a plurality of gel flow barriers 172a-172n (collectively referred to as gel flow barriers 172), a plurality of wire bond pads 174a-174n (collectively referred to as wire bond pads 174), a plurality of contact pads 170a-170n (collectively referred to as contact pads 170), which are positioned to approximately align with the corresponding plurality of planar mounting tabs 124a-124n. The upper side 180 of electronics board 122 further includes alignment marks 178a and 178b (used during wire bonding) and a plurality of PCB test points 176a-176n. FIG. 3 also shows strain gauges 182a and 182b (collectively referred to as strain gauges 182) connected to wire bond pads 174a-174n with wires 184a-184n. The gel flow barriers 172 on the electronics board 122 include a moat (shown in more detail in conjunction with FIG. 5) to redirect gel flow.

In one embodiment, the electronics board 122 is coupled to three planar mounting tabs 124a-124n. The planar mounting tabs 124a-124n define a plane, provide stable support for the electronics board 122 and provide mechanical support for springs 118 above them pushing on the corresponding contact pads 170. This avoids the springs 118 exerting force on unsupported areas of the electronics board 122. The planar mounting tabs 124a-124n also provide attachment points for the electronics board which can be soldered to the planar mounting tabs 124. The wire bond pads 174 are used for wire bond connections from the strain gauges 182 (i.e., the Wheatstone bridge) to the electronics board 122 and are, in one embodiment, gold plated pads approximately 1/16 inch square. During manufacture of the pressure sensor 100, gel is used to partially protect wire bond connections from the harsh automotive environment and is dispensed through the oversized wire bond window 140 in electronics board 122. In one embodiment, the gel is a two part self-curing flexible gel. The gel is used to cover parts susceptible to corrosion and to provide a partial environmental seal, but since the gel is non-conductive it needs to be kept away from contact pads 170.

Instead of using several conventional gel flow dams to hold back the gel, the gel flow barriers 172 fabricated on the electronics board 122 redirect the flow of the gel around the electronics board 122 features to be excluded from the gel flow. In one embodiment, gel is dispensed into the wire bond window 140 to encapsulate and protect the strain gauges 182. The gel continues to be dispensed so that the gel flows out of the wire bond window 140 to cover and protect the wire bond pads 174 and wires 184. When the gel reaches the gel flow barrier 172, instead of holding the gel back, the gel flow barrier 172 redirects the gel flow around the feature, here contact pads 170, from which the gel is to be excluded. In this manner, the gel flow barrier 172 prevents excess gel to flow on to areas of the electronics board 122 sensitive to its presence. Improved gel flow management provides cost savings and quality improvement because the use of several additional gel dams is not required and the gel flow barriers 172 which are made as part of the PCB manufacturing process can be flexibly located wherever required on the electronics board 122. In one embodiment, the gel flow barrier 172 has a "double eyebrow" shape formed from traces in the electronics board 122 arranged circumferentially around an electronics board feature to be excluded from the gel flow, here the spring contact pads 170.

Several other problems exist when dispensing the protective gel. Sometimes the gel doesn't flow where it is directed and occasionally air is trapped forming a bubble or a void in coverage. In these cases, the gel doesn't serve its protective function. Because of these problems it is sometimes necessary to inspect cured gel to see that everything to be protected has been covered with gel. Furthermore, sometimes the electronics board 122 is skewed with respect to the strain gauges 182. In response to these problems, it was discovered that changing the shape of the oversized wire bond window 140 reduces the effects of three problems. By providing an oversized wire bond window 140 instead of a convention rectangular window, it is easier to inspect the gel even if the oversized wire bond window 140 is skewed.

In one embodiment, the oversized wire bond window 140 includes rounded corners and is lengthened approximately on an axis along a longer dimension of strain gauges 182 mounted on the sense element port 114. The oversized wire bond window 140 assures that the edges of the strain gauges 182 are not obscured by the electronics board 122 even when skewed thereby providing for inspection of the strain gauges 182 and wires 184. Another benefit of the oversized wire bond window 140 is the reduced occurrence of bubbles or voids in the protective gel.

Figure 4:
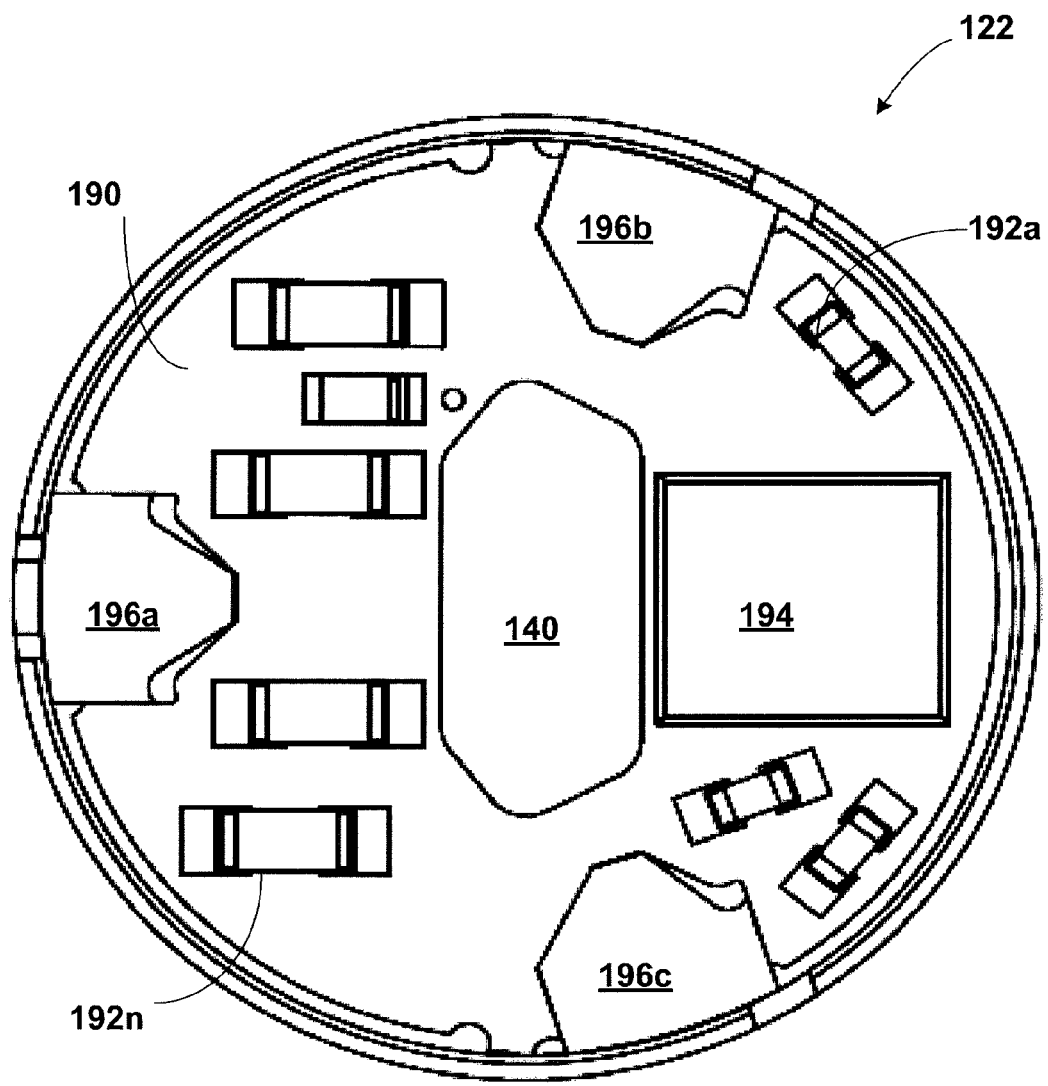
FIG. 4 is a bottom plan view of the electronics board of FIG. 3.

Referring now to FIG. 4, the bottom side 190 of electronics board 122 includes the oversized wire bond window 140, attachment tabs 196a-196c and electrical components 192a-192n (e.g., ceramic capacitors) and 194 (e.g., ASICS and other ICs). In contrast to conventional designs some of which have cantilevered support for PCBs, the planar mounting tabs 124 provide a stable mounting platform. Because the electronics board 122 is attached to the planar mounting tabs 124 which provide mechanical support for springs 118, damage from cracked components 192 and 194 is greatly reduced.

Figure 5:
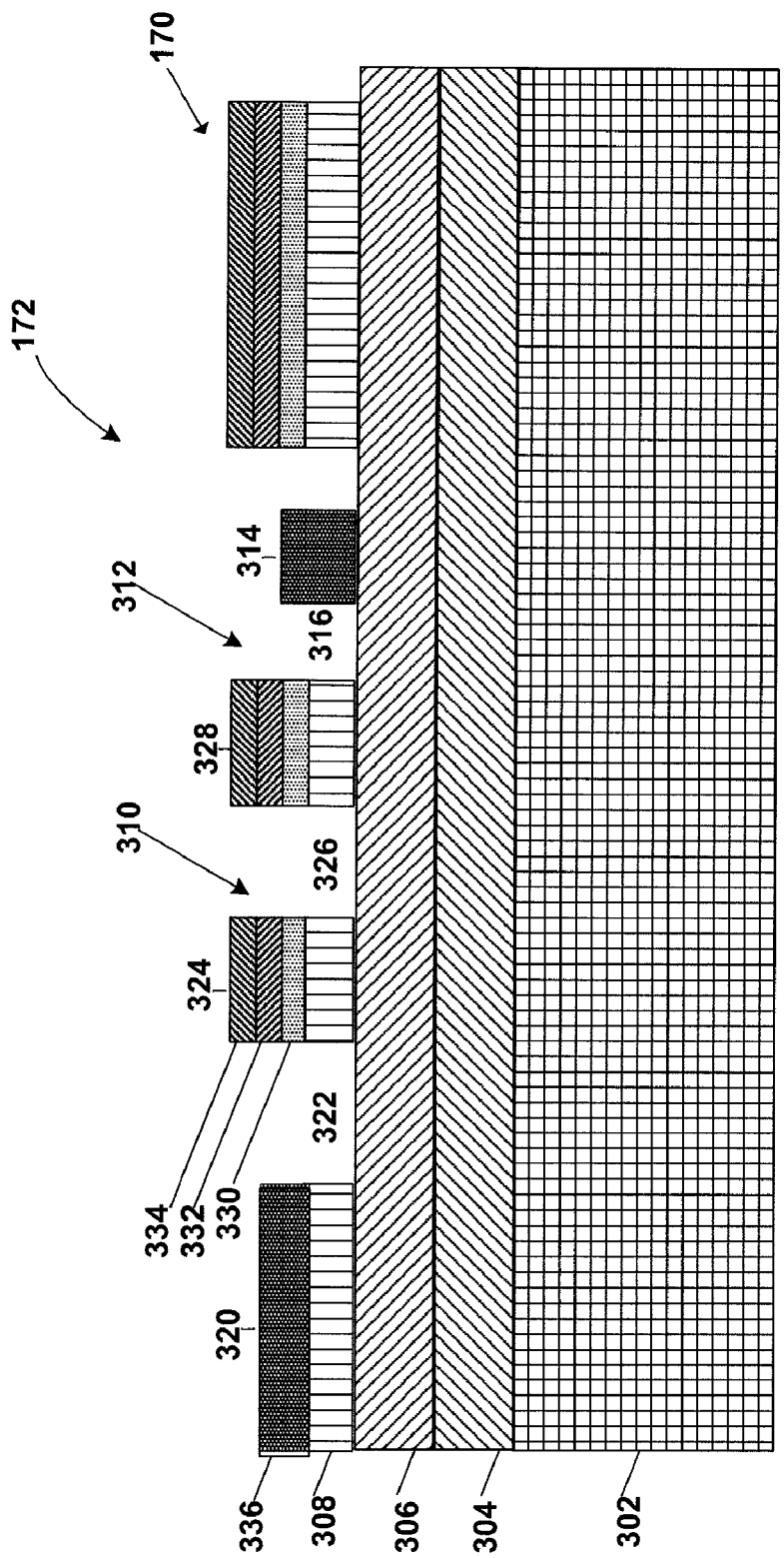
FIG. 5 illustrates a cross-sectional view of the gel flow barrier of FIG. 3.

FIG. 5 illustrates a cross-sectional view of the gel flow barrier 172 of FIG. 3. The gel flow barrier 172 is made using the printed circuit board process used to fabricate the electronics board 122 and in one embodiment a base of the gel flow barrier 172 includes a base layer 302, a base copper layer 304, and a pre-impregnated composite fiber layer 306. A first wall 320, a second wall 324, a third wall 328 and the contact pad 170 are disposed on top of the base layer 302. A first trench 322 is formed between the first wall 320 and the second wall 324. A second trench 326 is formed between the second wall 324 and the third wall 328. A third trench 316 is formed between the third wall 328 and the contact pad 170. The third trench 316 includes an optional fourth wall 314, here formed by a solder mask layer 336.

The first wall 320 includes a copper layer 308 and the solder mask layer 336. The second wall 324, the third wall 328 and the contact pad 170 each include a copper layer 308, a copper plating layer 330, a nickel plating layer 332 and a gold plating layer 334. The trenches 322, 326 and 316 form a moat which redirects the gel flow before the gel flow reaches the contact pad 170. The top of the moat (i.e., walls 320, 324 and 328) is preferably plated with gold because the gel generally does not wet to gold which prevents the gel flow from easily crossing the trenches towards the contact pads 170 which are also gold plated.

In one exemplary manufacturing process, the a gel flow barrier 172 is formed by fabricating the plurality of multilayer walls 320, 324 and 328 and corresponding trenches 322, 326 and 316 in the electronics board 122 surrounding a board feature to be protected from a gel flow, for example contact pad 170a. The trenches 322, 326 and 316 form a moat at least partially surrounding the board feature to be protected. The trenches can be formed by etching the electronics board down through the copper layer 308 using PCB board manufacturing techniques known in the art. The top surfaces of the walls 320, 324 and 328 can be plated or treated with a non-wetting material, for example gold, with respect to the gel.

Alternative embodiments (not shown) provide a trench to redirect the gel by means of a slot or slots in the PCB through which excess gel can drain downward before reaching the contact pads 170. In another embodiment, solder is added to the traces to increase the heights of the walls. It is also possible to create a dispensed gel flow barrier with optimize material selection for bead width and height and gel wetting characteristics. It is understood that the gel flow barrier 172 materials and wall heights and trench width can be optimized for specific gel types, gel bead widths and heights and gel wetting characteristics.

Figure 5A:
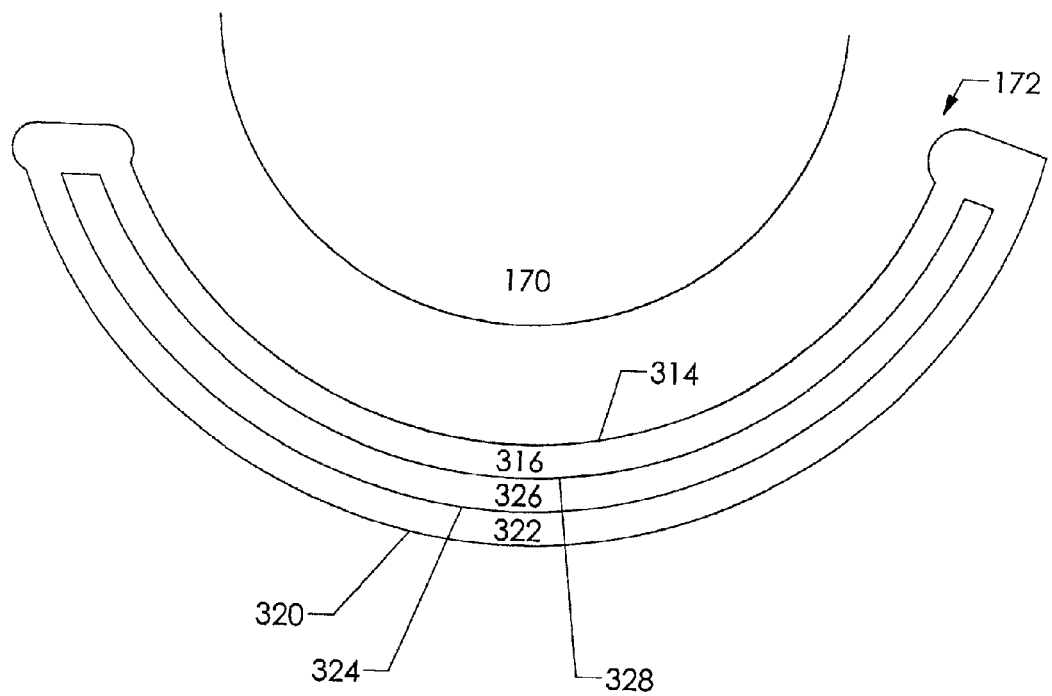
FIG. 5A illustrates a top view of the gel flow barrier of FIG. 5.

FIG. 5A illustrates a top view of the gel flow barrier 172 of FIG. 5. The gel flow barrier 172 includes the first wall 320, the second wall 324, and the third wall 328. The wall form the first trench 322, the second trench 326 and the third trench 316. In this embodiment the fourth wall 314 and the first wall 320 enclose the trenches 322, 326 and 316.

Figure 6A:
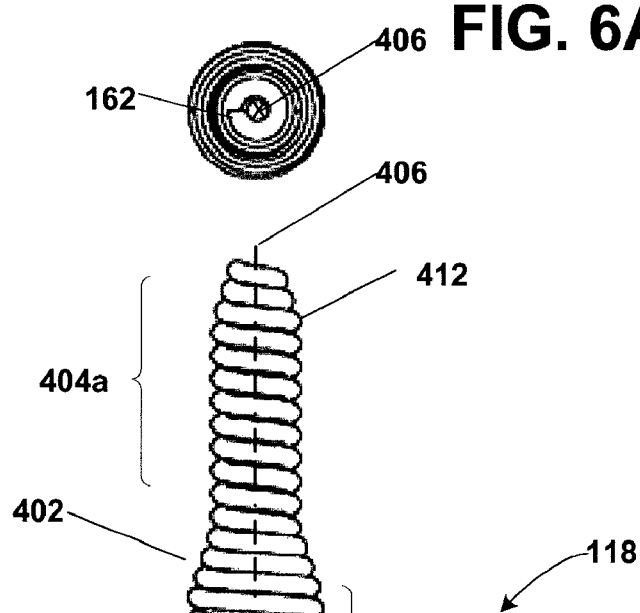
FIG. 6A is a side view of the contact spring of FIG. 6 illustrating the spring tip contact.
Figure 6:
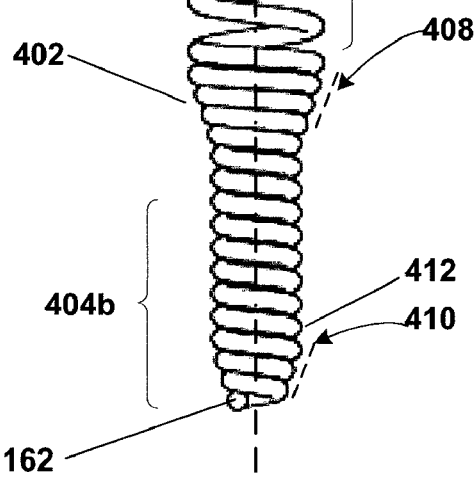
FIG. 6 is a view of the contact spring of FIG. 1.

FIG. 6 shows contact spring 118 of FIG. 1, which is a double-ended symmetrical spring having a section of active coils 400, first tapered sections 402 (indicated by taper line 408), and ends 404a and 404b having a section of dead coils which terminate in the spring tip contact points 162. The ends 404 have second tapered sections 412 (indicated by taper line 408). The spring tip contact points 162 make a connection to contact pads at one end 404a and to the ECU at the opposite end 404b. The spring 118 also includes shoulders at the first tapered sections 402 which allow the spring 118 to be retained in the upper spring guide 120 and lower spring guide 134. Because the spring 118 is symmetrical, hand loading into the spring guides 120 and 134 is not required as it is in the production of some conventional pressure sensors. The double-ended symmetrical feature facilitates bowl feeding and the use of pick and place manufacturing equipment. The second tapered sections 412 bring the spring tip contact points 162 closer to a center axis 406 of the spring 118. It is understood that the first tapered sections 402 also contribute to bringing the spring tip contact points 162 nearer to the center axis 406. Springs 118 can be used instead of more costly pogo pins or non-symmetrical springs requiring manual assembly, which are both used in conventional sensors.

Because the target of the spring tip contact points 162 (i.e., contact pads 170) are small and because the assemblies (upper spring guide 120 and lower spring guide 134, electronics board 122 and support ring 110) should be aligned to contact three targets at the same time there exist the possibility of tolerance stack up problems. In order to locate the assemblies rotationally and in horizontal dimensions to hit the three targets, one feature that affects tolerances is a position of the highest point on the spring (i.e., the spring tip contact points 162). The taper sections 402 and 412 in the spring 118 cause the spring tip contact point 162 at each end 404 of the spring to be located closer to the center axis 406 (also referred to as center line 406) of the spring 118. In other words, the taper 410 pulls the spring tip contact points 162 towards the center, reducing the off center distance of each spring 118 and significantly easing the tolerance stack up problem by effectively providing additional tolerance in the assembly of the pressure sensor 100.

FIG. 6A is a side view of the contact spring of FIG. 6 illustrating the spring tip contact point 162. Because of the taper in spring 118 the spring tip contact point 162 at each end of the spring 118 is closer to a center axis 406 of the spring. In other words, the spring 118 has a smaller diameter tip than the middle of the spring which is beneficial for contacting the contact pad 170.

Figure 7:
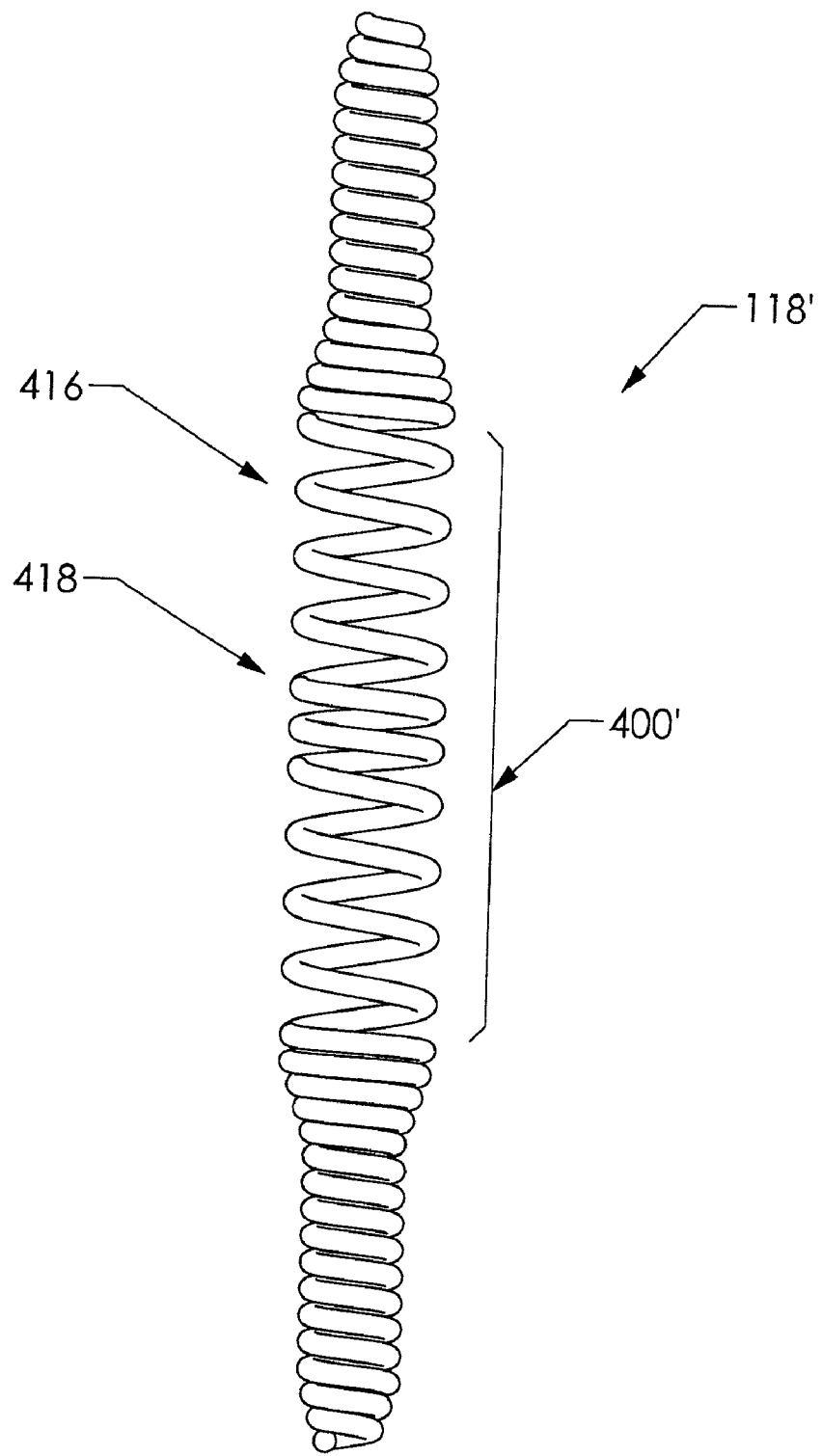
FIG. 7 is a view of a contact spring similar to the contact spring of FIG. 6 having variable pitched active coils.

FIG. 7 is a view of a contact spring 118' similar to the spring 118 of FIG. 6 having a variably pitched active coil portion 400' including first pitch 416 and here, for example, smaller pitch 418. The variably pitched active coil portion 400' reduces the incidence of spring entanglement due to springs nesting together during automatic manufacturing operations without affecting the required length and force specifications of the contact spring 118'.

Although the invention has been described with regards to specific preferred embodiments thereof, variations and modifications will become apparent to those of ordinary skill in the art. It is therefore, the intent that the appended claims be interpreted as broadly as possible in view of the prior art to include such variations and modifications. For example, the invention would equally be applicable to pressure/temperature sensors, force sensors, etc.

What is claimed is:

1. A gel flow barrier on an electronics board comprising a moat having at least one wall forming at least one trench to redirect a gel flow around a contact pad on the electronics board to be excluded from the gel flow and the moat at least partially surrounding the contact pad, the moat including a top layer having a non-wetting surface with respect to the protective gel.

2. The gel flow barrier of claim 1, wherein the moat further comprises a plurality of trenches and walls.

3. The gel flow barrier of claim 1, wherein non-wetting surface is gold plated.

4. The gel flow barrier of claim 1, wherein the electronics board is used in a sensor.

* * * * *